United States Patent
Wan et al.

(10) Patent No.: US 7,600,163 B2
(45) Date of Patent: Oct. 6, 2009

(54) CONVOLUTIONAL INTERLEAVER AND DEINTERLEAVER

(75) Inventors: Bin Wan, Sunnyvale, CA (US); Chia-Liang Lin, Union City, CA (US)

(73) Assignee: Realtek Semiconductor Corp., HsinChu (TW)

( * ) Notice: Subject to any disclaimer, the term of this patent is extended or adjusted under 35 U.S.C. 154(b) by 915 days.

(21) Appl. No.: 10/669,308

(22) Filed: Sep. 23, 2003

(65) Prior Publication Data
US 2005/0063421 A1    Mar. 24, 2005

(51) Int. Cl.
*H04J 3/06* (2006.01)
(52) U.S. Cl. .......... 714/701; 711/127; 714/786
(58) Field of Classification Search .......... 714/701
See application file for complete search history.

(56) References Cited
U.S. PATENT DOCUMENTS

| | | | |
|---|---|---|---|
| 6,035,427 A | 3/2000 | Kweon | |
| 6,058,496 A | 5/2000 | Gillis et al. | |
| 6,154,826 A * | 11/2000 | Wulf et al. | 711/217 |
| 6,954,885 B2 * | 10/2005 | Hurt et al. | 714/701 |
| 6,971,057 B1 * | 11/2005 | Delvaux et al. | 714/788 |

FOREIGN PATENT DOCUMENTS

WO    02101937    12/2002

* cited by examiner

*Primary Examiner*—M. Mujtaba K Chaudry
*Assistant Examiner*—Enam Ahmed
(74) *Attorney, Agent, or Firm*—Winston Hsu

(57) ABSTRACT

An apparatus for receiving and storing an incoming sequence and for forwarding the bytes of the incoming sequence as an outgoing sequence in a different byte order includes a cache memory and a main memory for storing bytes of the incoming sequence until they can be forwarded as bytes of the outgoing sequence. A control circuit selectively burst mode writes sequences of incoming bytes that need be stored for a relatively long time to blocks of sequential addresses of the main memory, writes individual bytes of the incoming sequence that need be stored for a relatively short time to selected addresses of the cache memory, and reads bytes out of the cache memory and the main memory when needed to form the outgoing sequence.

25 Claims, 4 Drawing Sheets

CONVOLUTIONAL INTERLEAVER AND DEINTERLEAVER

BACKGROUND OF THE INVENTION

1. Field of the Invention

The present invention relates in general to a convolutional interleaver or deinterleaver for rearranging bytes forming words of an input word sequence to produce an output word sequence, and in particular to a convolutional interleaver or deinterleaver employing both a direct memory accessed external memory and an internal cache memory for temporarily storing bytes of the input word sequence until they are incorporated into the output word sequence.

2. Description of Related Art

FIG. 1 depicts a typical prior art communication system including a transmitter 10 for converting an input data sequence TX into an outgoing analog signal V1 transmitted through a communication channel 14 to a receiver 12. Receiver 12 converts signal V2 back into an output data sequence RX matching the transmitters' incoming data sequence TX. Since channel 14 can introduce random noise into signal V2, it is possible that some of the bits of the RX sequence will not match corresponding bits of the TX sequence. To reduce the likelihood that noise in channel 14 will produce errors in the RX sequence, transmitter 10 includes a forward error correction (FEC) encoder 16, such as for example a Reed-Solomon encoder, for encoding the incoming data sequence TX into a sequence A of N-byte words. Each word of sequence A "over-represents" a corresponding portion of the TX sequence because it contains redundant data. A convolutional interleaver 18 interleaves bytes of successive words of word sequence A to produce an output word sequence B supplied to a modulator 20. Modulator 20 generates signal V1 to represent successive bytes of word sequence B. A demodulator 22 within receiver 12 demodulates signal V2 to produce a word sequence B'. Word sequence B' will nominally match the word sequence B input to the transmitter's modulator 20, though some of the bytes forming word sequence B' may include bit errors caused by noise in channel 14. A deinterleaver circuit 24 deinterleaves word sequence B' to produce a word sequence A' nominally matching word sequence A, although it too may include errors resulting from the errors in word sequence B'. An FEC decoder 26 then decodes word sequence A' to produce the output data sequence RX.

Although the A' sequence may contain some errors, it is possible for FEC decoder 26 to produce an outgoing sequence RX matching the TX sequence because words of the A' sequence contain redundant data. When a portion of an A' sequence word representing any particular portion of the RX data is corrupted due to an error in the B' sequence, another redundant portion of the A' sequence word also representing that particular portion of the RX sequence may not be corrupted. FEC decoder 26 is able to determine which portions of each A' sequence word are not corrupted and uses the uncorrupted portions of those words as a basis for determining bit values of its corresponding portion the RX sequence. Each possible FEC scheme will have a limited capability for correcting byte errors. For example, a (255, 16) Reed-Solomon code, including 16 bytes of redundant data to form a 255 bytes code word can correct up to 8 byte errors, but no more.

It is possible for some portion of the RX sequence to contain an error when there are excessive errors within an A' sequence word representing that particular portion of the RX sequence, but interleaver 18 and deinterleaver 24 help to reduce the chances of that happening. Since noise in channel 14 can occur in bursts that may persist long enough to corrupt portions of signal V1 conveying every byte of a B' sequence word, interleaver 18 improves the system's noise immunity by interleaving bytes of successive words of sequence A to produce word sequence B. Since each word of sequence A produced by FEC encoder 16 contains redundant data describing a particular section of the TX sequence, interleaving the words of sequence A to produce words of sequence B has the effect of spreading out information conveyed by signal V1 so that a single noise burst in channel 14 is less likely to corrupt an excessive number of bytes of information representing the same portion of the TX sequence.

FIG. 2 shows an example of how interleaver 18 might rearrange bytes of sequence A to produce sequence B. In this example each $i^{th}$ word $A_i$ of sequence A includes five bytes $A_{i,0}$ through $A_{i,4}$ and each $i^{th}$ word of sequence B has five bytes $B_{i,0}$ through $B_{i,4}$. This particular interleaving scheme has an "interleaving depth" D=4 because as shown in FIG. 2 the five bytes of each word $A_i$ of sequence A appear as every fourth byte of sequence B. Since the longest noise burst the system can tolerate is a function of how widely interleaver 18 separates the data in sequence B, the noise tolerance of the system increases with interleaving depth D.

When interleaver 18 has an interleaving depth D it must delay each $j^{th}$ byte $A_{i,j}$ of each $i^{th}$ word $A_i$ of sequence A by $(D-1) \times j$ bytes to form a byte of sequence B. Since interleaver 18 must store a byte in order to delay it, the number of bytes of sequence A interleaver 18 must concurrently store increases with interleaving depth D. When interleaver 18 stores each word of sequence A until it no longer needs any byte of that word to produce a word of sequence B, then the total number of bytes interleaver 18 must concurrently store is N×D where N is the number of bytes per word. Deinterleaver 24 will require a similar internal storage capacity to deinterleave the B' sequence. Thus, the noise immunity interleaver 18 and deinterleaver 24 can provide is a function of its storage capacity.

FIG. 3 illustrates a prior art interleaver 18 including a controller 28, an input buffer 30, a static random access memory (SRAM) 32 and an output buffer 34 all of which may be implemented on the same integrated circuit (IC) 35. FEC encoder 16 (FIG. 1) writes successive bytes of each successive word of sequence A into input buffer 30, and whenever it has written an entire word of sequence A into buffer 30 it pulses an INPUT_READY input signal to controller 28. Controller 28 responds to the INPUT_READY signal by writing each byte of the sequence A word in buffer 30 to a separate address of SRAM 32. Controller 28 then sequentially reads each byte that is to form a next word of sequence B out of SRAM 32, stores it in output buffer 34 and then sends an OUTPUT_READY signal to modulator 20 (FIG. 1) telling it that it may read a next word of sequence B out of output buffer 34.

The algorithm controller 28 employs for producing read and write addresses for SDRAM 32 ensures that each incoming word of sequence A into SRAM 32 overwrites a previous word of sequence A that is no longer needed and ensures that bytes forming words of sequence B are read in the proper order. To interleave N-byte words of incoming sequence A with an interleaving depth D, SRAM 32 must have D×N addressable byte storage locations. The interleaver architecture illustrated in FIG. 3 is typically employed when interleaver 18 can be implemented on a single IC 35, but when N×D is large it becomes impractical to embed a sufficiently large SDRAM 32 in a single IC.

FIG. 4 illustrates another prior art architecture for an interleaver 18' including a controller 28', an input buffer 30' and an output buffer 34' included within a single IC 35'. Interleaver 18' employs an external synchronous dynamic random access memory (SDRAM) 36 for storing bytes rather than an internal SRAM. While controller 28 of FIG. 3 can directly read and write accesses each byte of SRAM 32, controller 28' of FIG. 4 can only access data in SDRAM 36 via a direct memory access (DMA) controller 38. Rather than individually read and write accessing each byte stored in SDRAM 36, DMA controller 38 operates in a "burst" mode wherein it read or write accesses bytes stored at several (typically 16) successive addresses. Thus when controller 28' wants to obtain particular bytes stored in SDRAM 36 to write into output buffer 34', it must ask DMA controller 38 to read a block of bytes including the particular bytes needed to form the next output sequence word. Controller 28' then transfers those particular bytes to output buffer 34'. However since bytes are not addressed in SDRAM in the order in which they are needed to from bytes of the outgoing word sequence, many of the bytes DMA controller 38 reads from SDRAM 36 during each DMA read access will be discarded.

Deinterleaver 24 of FIG. 1 may have the same topology as interleaver 18 of FIG. 3 or of FIG. 4, with the controller 28 or 28' of the deinterleaver implementing an algorithm that deinterleaves the B' sequence to produce the A' sequence.

Since SDRAMs are relatively inexpensive, it can be more cost effective for an interleaver or deinterleaver to employ the architecture of FIG. 4 than that of FIG. 3, particularly when a large amount of memory is needed. However since read and write access to an internal SRAM is typically faster than that of an external SDRAM, interleaver 18 of FIG. 3 can have a higher throughput (in bytes per second) than interleaver 18' of FIG. 4. The maximum throughput of the interleaver of FIG. 4 can be further limited because much of the bandwidth of SDRAM 36 is wasted reading bytes that are discarded.

What is needed is an interleaver or deinterleaver employing a DMA controller to access an inexpensive external memory, but which improves its data throughput by making more efficient use of its DMA data transfer bandwidth.

BRIEF SUMMARY OF THE INVENTION

A convolutional interleaver or deinterleaver interleaves or deinterleaves a sequence of N-byte incoming words to form a sequence of N-byte outgoing words, with a variable interleaving depth D. An interleaver or deinterleaver in accordance with the invention employs both an external memory and a cache memory for storing bytes of the incoming word sequence until they can be formed into words of the outgoing word sequence. The external ("main") memory, read and write accessed via a DMA controller, is suitably large enough to hold (Nmax×Dmax bytes) where Nmax is the largest allowable byte width N of each word and Dmax is the largest allowable interleaving depth D. The DMA controller operates in a burst read or write mode in which it read or write accesses a block consecutive addresses of the main memory whenever it read or write accesses the main memory. The cache memory is smaller than the main memory preferably having (BurstLen×Dmax) storage locations, where BurstLen is the number of bytes read from or written to sequential addresses of the main memory during each DMA read or write access. The interleaver or deinterleaver can independently read or write access each individual cache memory address.

When (N×D) is less than (BurstLen×Dmax), the cache memory is sufficiently large to accommodate all of the byte storage requirements of the interleaver or deinterleaver, and only the cache memory is used for storing bytes of the incoming word sequence. The interleaver or deinterleaver writes each byte of each incoming word sequence directly into the cache memory, overwriting a previous word of the incoming word sequence that is no longer needed. On the other hand, interleaver or deinterleaver obtains a next outgoing sequence word from bytes it reads out of the cache memory.

When (N×D) exceeds the size (BurstLen×Dmax) of its cache memory, the interleaver uses the main memory to store incoming sequence words as they arrive and uses its cache memory to store bytes forming a next set of output sequence words it is to generate. When a word of the incoming sequence arrives in an input buffer, the interleaver commands the DMA controller to write bytes of the incoming sequence word to the main memory. The interleaver also writes to the cache memory any bytes of the incoming word that are to be included in the set of outgoing sequence words currently stored in the cache memory. Thereafter the interleaver generates a next word of the outgoing sequence by reading the bytes that form it out of the cache memory and writing them into an output buffer. After transferring each word of the set of outgoing sequence words stored in the cache memory to the output buffer, the interleaver commands the DMA controller to read all bytes out of the main memory that are to be included in a next set of outgoing sequence words and stores those bytes at appropriate locations in the cache memory until they are transferred to the output buffer. The cache memory improves interleaver throughput by maximizing the number of bytes that the DMA controller reads from the main memory during each burst mode DMA read access that can be incorporated into outgoing sequence words.

When (N×D) is larger than the address space of its cache memory, the deinterleaver uses its cache memory to store bytes forming only as many of most recently received set of incoming sequence words as it can hold and uses its main memory to store bytes forming outgoing sequence words. When an incoming sequence word arrives in its input buffer, the deinterleaver forms a next word of the outgoing sequence by transferring any bytes of that outgoing sequence word currently residing the main memory into the output buffer, and by transferring all other bytes of that outgoing sequence word from the cache memory to the output buffer. The interleaver then writes all of the bytes of the incoming sequence word into the cache memory.

Whenever the deinterleaver has filled the cache memory with incoming sequence words, it flushes the cache memory by reading bytes out of the cache memory and using the DMA controller to write those bytes into the main memory. In doing so, the bytes are arranged within the main memory addressed in an order in which the DMA controller can sequentially access them when needed to form output sequence words. This increases the percentage of bytes the DMA controller subsequently reads out of the main memory when forming an output sequence word, thereby improving DMA transfer efficiency and increasing the maximum throughput of the deinterleaver.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The present invention relates to the use of a cache memory in a convolutional interleaver or a convolutional deinterleaver.

The specification describes exemplary embodiments of the invention considered to be best modes of practicing the invention.

Interleaver

Figure 5:
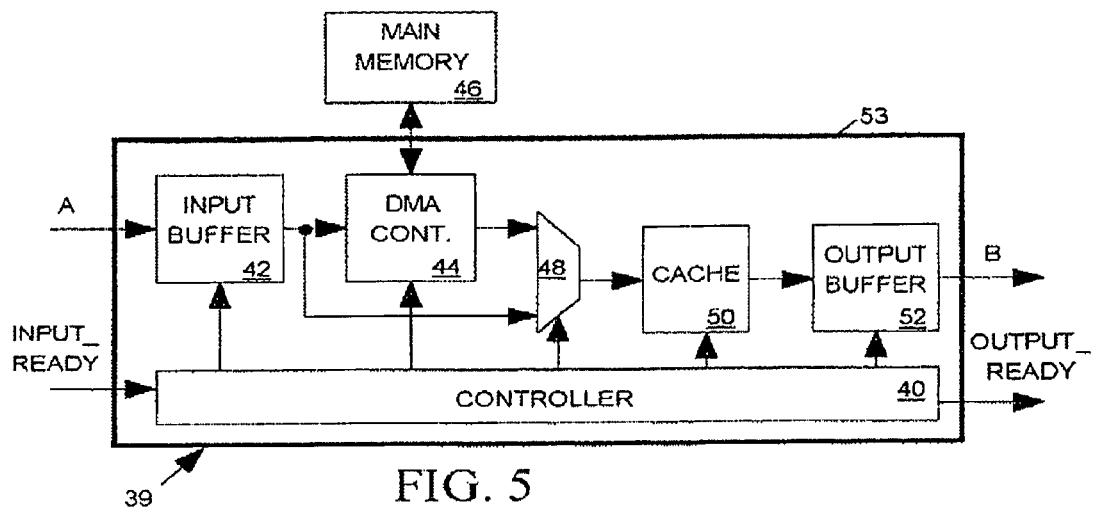
FIG. 5 depicts an example convolutional interleaver in accordance with the invention in block diagram form.

FIG. 5 depicts an example of a convolutional interleaver 39 in accordance with the invention including a controller 40, an input buffer 42, a direct memory access (DMA) controller 44, a multiplexer 48, a cache memory 50 and an output buffer 52 all of which are preferably implemented on a single integrated circuit (IC) chip 53. DMA controller 44 read and write accesses a "main" memory 46, suitably an SDRAM external to IC chip 53. Interleaver 39 convolutionally interleaves a sequence A of N-byte incoming words with an interleaving depth D ranging up to Dmax to form a sequence B of N-byte outgoing words. The number N of bytes in each incoming word and in each outgoing word may range up to a maximum number Nmax, such as for example 255. Controller 40 is suitably implemented as a programmable state machine so that the values of N and D can be selected by the manner in which controller 40 is programmed.

Main memory 46 suitably has a least Nmax×Dmax storage locations, with each addressable storage location sized to hold a single byte. DMA controller 44 operates in a burst read and write mode wherein it read or write accesses many successive addresses of main memory 46 whenever it read or write accesses main memory 46. Cache memory 50 preferably includes at least BurstLen×Dmax storage locations where BurstLen is the number (e.g. 16) of successive addresses DMA controller accesses during each burst mode read or write access (its "burst length"). Cache memory 50 can also store one byte at each of its addressable storage locations, but controller 40 can separately and independently read and write access each of its addressable storage locations.

Figure 6:
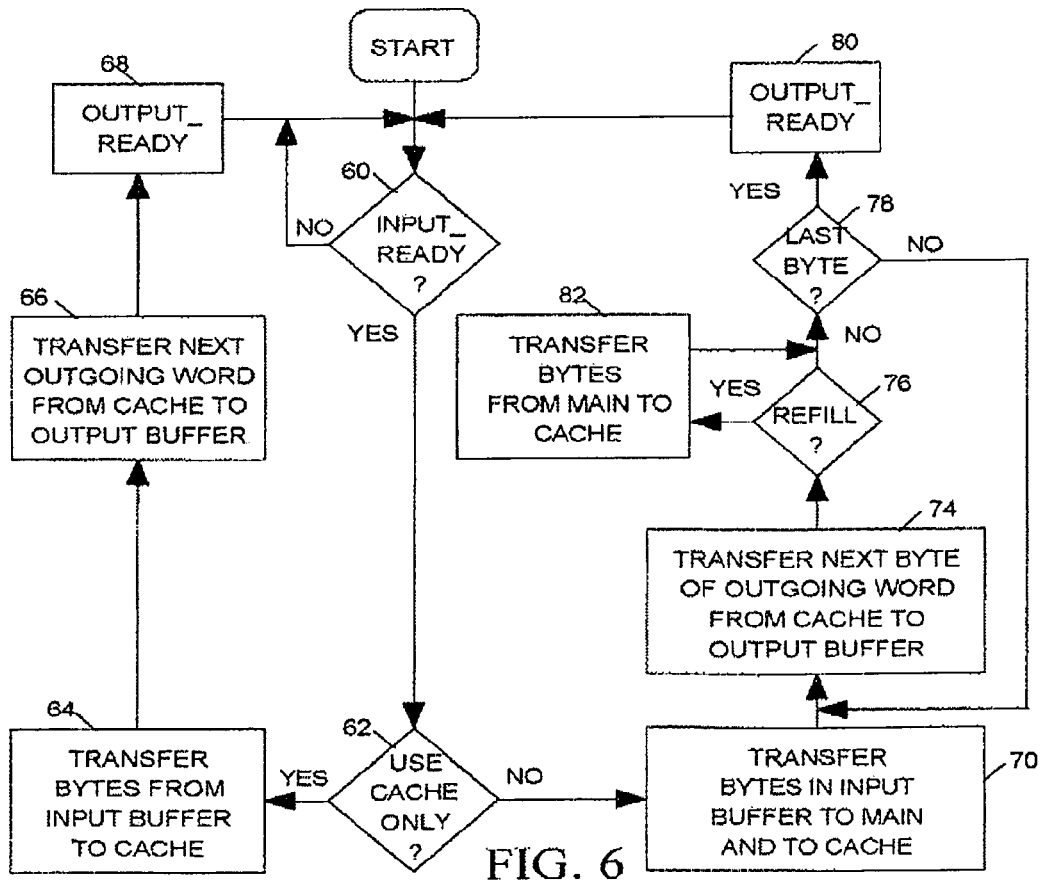
FIG. 6 is a flow chart representing an algorithm executed by the controller of FIG. 5.

FIG. 6 is a flow chart illustrating an example of controller 40 operation. Referring to FIGS. 5 and 6, controller 40 waits (step 60) until it detects an INPUT_READY signal pulse indicating that an external circuit has written a next word of incoming sequence A into input buffer 42. When the product of word length N and interleaving depth D (N×D) does not exceed the number of bytes cache memory 50 can store (step 62), controller 40 responds to the INPUT_READY signal pulse by signaling DMA controller 44 and multiplexer 48 to transfer all bytes of the incoming sequence word currently residing input buffer 42 into cache memory 50 (step 64). Controller 40 then reads all bytes that are to form a next word of outgoing sequence B out of cache memory 50 and transfers them to output buffer 52 (step 66). Controller 40 thereafter pulses the OUTPUT_READY signal (step 68) and returns to step 60 to await arrival of another word of incoming sequence A in input buffer 42.

Whenever it writes bytes of an incoming sequence word into cache memory 50 at step 64, controller 40 overwrites the bytes forming the output sequence word last read out of cache memory 50 at step 66 since it is no longer necessary to store the overwritten bytes in cache memory 50. Note that when N×D is smaller than the number of available storage locations in cache memory 50, interleaver 39 does not use main memory 46 for byte storage.

When (N×D) is larger than the number of storage locations in cache memory 50, controller 40 uses main memory 46 to hold bytes of all incoming sequence words until they are needed and uses cache memory 50 for storing bytes that are to form as many outgoing sequence words as the cache memory can hold. When controller 40 detects an INPUT_READY signal pulse (step 60), and when (N×D) is larger than the capacity of cache memory 50 (step 62), controller 40 responds to the INPUT_READY pulse by commanding DMA controller 44 to write bytes of the incoming sequence word stored in input buffer 42 into main memory 46 (step 70), overwriting bytes stored therein that are no longer needed. Controller 40 also (at step 70) transfers to cache memory 50 any bytes currently residing in input buffer 42 that are to be included in any of the outgoing sequence words currently stored in cache memory 50.

Thereafter controller 40 transfers a first byte of a next word of output sequence B from cache memory 50 to output buffer 52 (step 74). If it is not necessary at that point to refill cache memory 50 (step 76) and if the controller has not transferred the last byte of the next word of output sequence B to output buffer 52 (step 78), then controller 40 returns to step 74 to transfer a next byte of the next output sequence word from cache memory 50 to output buffer 52. Controller 40 continues to loop through steps 74-78 until it written all bytes of the next output sequence word into output buffer 52. Controller 40 then pulses the OUTPUT_READY signal (step 80) to signal an external circuit that the next output sequence word is available in output buffer 52 and returns to step 60 to await a next input sequence word.

Whenever at step 76 controller 40 determines that it has transferred every byte currently in cache memory 50 to output buffer 52, controller 40 refills cache memory 50 by transferring bytes that are to form a next set of output sequence words from main memory 46 to cache memory 50 (step 82). To do so controller 40 commands DMA controller 44 to read appropriate sequences of bytes from main memory 46, and then transfers bytes DMA controller 44 reads to appropriate addresses of cache 50. Not every byte needed to form the next set of outgoing sequence words will be written into cache memory 50 at step 82 because some of those bytes will not yet have arrived in incoming sequence words. However as the incoming sequence words containing the missing bytes arrive in input buffer 42, controller 40 will transfer those missing bytes from input buffer 42 to the appropriate addresses of cache memory 50 at step 70, thereby completing each output sequence word currently stored in cache memory 50 before that output sequence word is transferred to the output buffer 52 at steps 74-78.

Thus as described above, interleaver 39 uses main memory 46 for storing bytes only when the N×D exceeds the number of available storage locations in cache memory 50 and uses only cache memory 50 for storing bytes of incoming words until they are needed to form outgoing words. Otherwise, interleaver 39 uses main memory 46 for storing all input sequence words and uses cache memory 50 for storing bytes of only as many output sequence words as it can hold.

Figure 1:
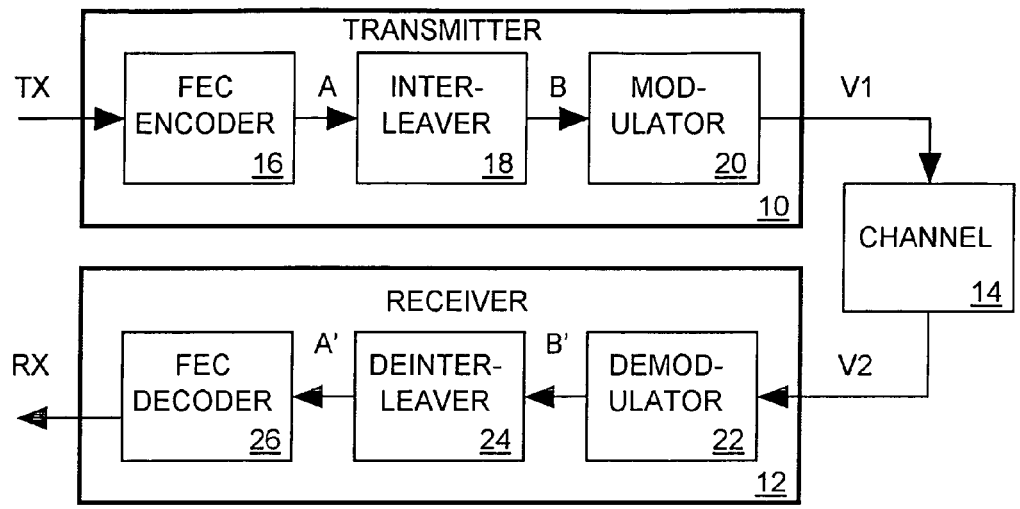
FIG. 1 depicts a prior art data communication system in block diagram form.
Figure 2:
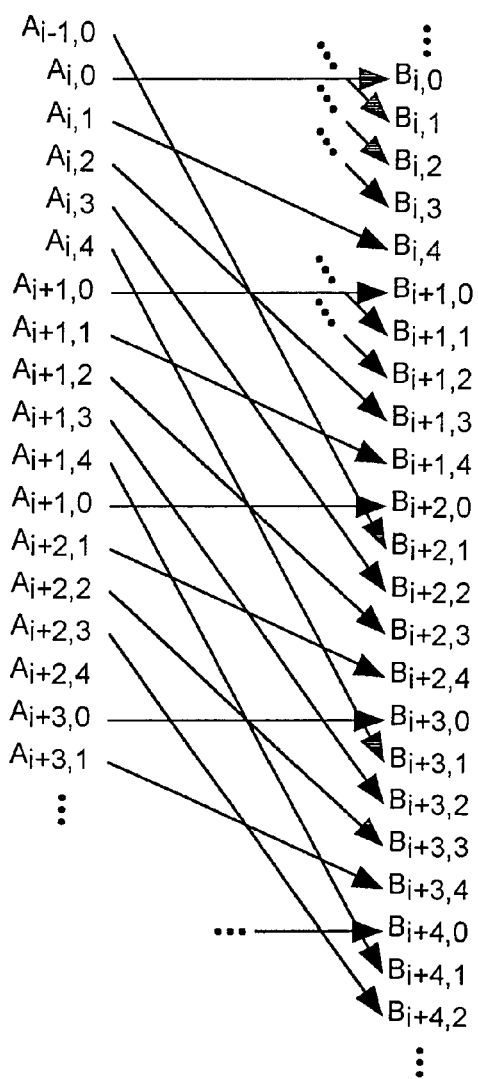
FIG. 2 depicts how the interleaver of FIG. 1 convolutionally interleaves words of an incoming sequence to produce words of an outgoing sequence.
Figure 3:
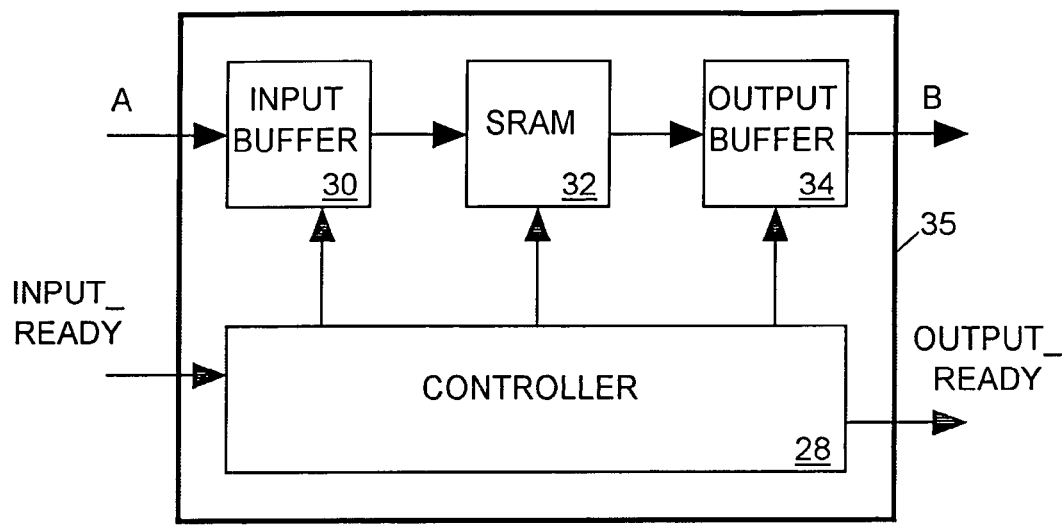
FIGS. 3 and 4 depict prior art convolution interleavers in block diagram form.
Figure 4:
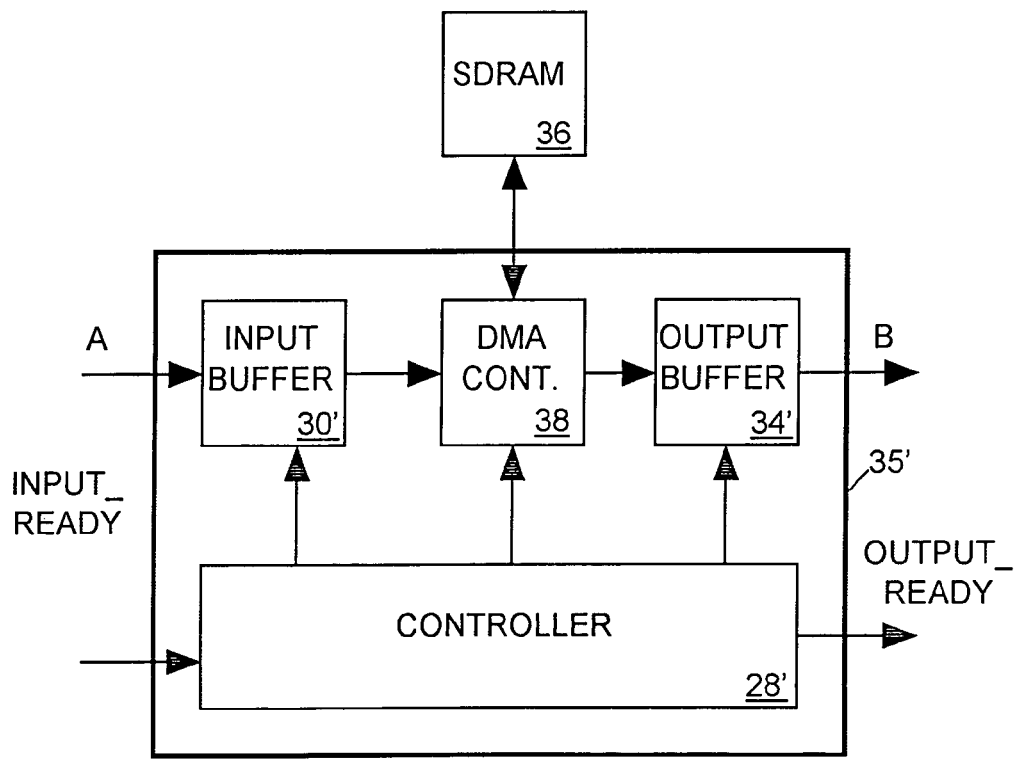

Cache memory 50 improves the efficiency of DMA read accesses of interleaver 39 compared to the prior art interleaver of FIG. 4 because it reduces the number of bytes its DMA controller reads that have to be discarded. The DMA controller of the prior art interleaver of FIG. 4 reads bytes that are to be included in several outgoing sequence words during each DMA read access, but only those bytes to be incorporated into the next outgoing sequence word are actually used; the rest of the bytes the DMA controller reads are discarded and must be read again at other times when they are actually needed to form a next output sequence word. Since the cache memory 50 of interleaver 39 of FIG. 5 can hold bytes that are to form many outgoing sequence words, fewer of the bytes DMA controller 44 need be discarded. Cache memory 50 therefore reduces the frequency with which DMA controller 44 must read access main memory 46, thereby increasing the interleaver's available throughput.

Interleaver Algorithm

The following is a list of variables employed in a pseudocode representation of the algorithm depicted in FIG. 6:

Dmax: Maximum interleaver depth (e.g., 64 for ADSL applications)
BurstLen: Burst length of DMA {16, 32, 64, . . . }
D: Interleaving depth
N: Word length
i: Word index (0 to D−1)
j: Byte index within the word (0 to N−1)
UseIntBuf: Use cache memory only flag
DmaRdLen: DMA read length=BurstLen×Dmax/D
DmaRdAddr: Starting main memory DMA read address
DmaWrLen: DMA write length, equal to N
DmaWrAddr: Starting main memory DMA write address
DmaRdRqCnt: DMA read request count during the cache refill (0 to D−1)
DmaRdPtr: Pointer for DMA read (0 to DmaRdLen−1)
CacheFillCnt: Cache refill count (0 to ceil((N×D)/(BurstLen×Dmax))−1)
InRdPtr: Input buffer read pointer
CacheWrPtr: Cache write pointer
CacheRdPtr: Cache read pointer
OutWrPtr: Output buffer write pointer The following is the pseudocode representation of the algorithm of FIG. 6.

```
1 'Initialize
    Set i=0, CacheFillCnt=0
    If (N×D) < (BurstLen × Dmax),
        set UseIntBuf = 1
        set CacheRdPtr = 0
    Else
        set UseIntBuf=0
        set CacheRdPtr= BurstLen × Dmax
    End if
```

```
2 'Wait for input word
    Wait for INPUT_READY
    If (UseIntBuf == 1) go to step 3 else go to step 4
```

```
3 'Transfer bytes from Input buffer to cache
    Read bytes in input buffer and write to cache with
        InRdPtr = mod(N-floor(i × N/D) + j,N) and
        CacheWrPtr = mod(i × N,D)+j × D, for j = 0 to N−1
    Set OutWrPtr = 0
    Go to step 5
```

```
4 'Transfer bytes from input buffer to main and cache
    start DMA  write at DmaWrAddr = mod(i × N,D) × 256,
    for j = 0 to N−1
        obtain j^{th} byte of N-byte DMA write from
        InRdPtr = mod(N-floor(i × N/D)+j,N),
        after InRdPtr reaches 0 and until mod(j,DmaRdLen)=0
            also write the j^{th} byte to
            CacheWrPtr=mod(i × N,D)+mod(j,DmaRdLen) × D
    End For
    Set OutWrPtr=0
```

```
5 'Transfer bytes from cache to output buffer
    While (OutWrPtr < N and CacheRdPtr < BurstLen × Dmax)
        move byte at CahceRdPtr to OutWrPtr
        set OutWrPtr = OutWrPtr+1
        set CacheRdPtr = CacheRdPtr+1
    end while
    If (OutWrPtr == N) go to step 7 Else go to step 6
```

```
6 'Transfer bytes from main to Cache
    Set DmaRdRqCnt=0
    While (DmaRdRqCnt<D)
        DMA read  min(DmaRdLen,N-CacheFillCnt × DmaRdLen)
        bytes
        starting at DmaRdAddr=CacheFillCnt ×
        DmaRdLen+DmaRdRqCnt ×256
        write each byte read to   CacheWrPtr =
        DmaRdPtr × D+DmaRdRqCnt
        Set DmaRdRqCnt = DmaRdRqCnt+1
    End While
    Set CacheRdPtr = 0
    Go to step 5
```

```
7 'Output ready
    Set i = i+1
    Pulse OUTPUT_READY
    If (i == D) go to step 1 Else go to step 2
```

Deinterleaver

Figure 7:
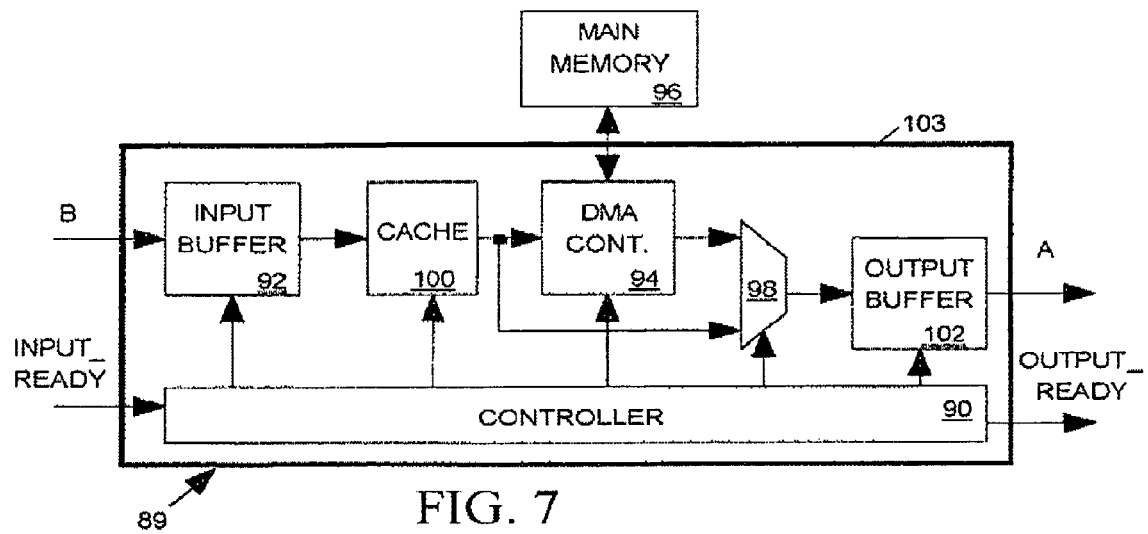
FIG. 7 depicts an example convolutional deinterleaver in accordance with the invention in block diagram form.

FIG. 7 depicts an example of a deinterleaver 89 in accordance with the invention including a controller 90, an input buffer 92, a direct memory access (DMA) controller 94, a multiplexer 98, a cache memory 100 and an output buffer 102 all of which are preferably implemented on a single integrated circuit (IC) chip 103. Deinterleaver 89 also includes a main memory 96, suitably an SDRAM, external to IC chip 103 that DMA controller 94 read and write accesses. Deinterleaver 89 convolutionally deinterleaves a sequence B of N-byte incoming words that has been interleaved with an interleaving depth D ranging up to Dmax to form a sequence A of N-byte outgoing words. The number N of bytes in each incoming word and in each outgoing word may range up to a maximum number Nmax, such as for example 255. Controller 90 is suitably implemented as a programmable state machine so that the values of N and D can be selected by the manner in which controller 90 is programmed.

Main memory 96 suitably has at least Nmax X Dmax addressable storage locations, each sized to hold a single byte. DMA controller 94 operates in a burst read and write mode in which it read or write accesses many successive addresses of main memory 96 whenever it read or write accesses main memory 96. Cache memory 100 preferably has at least (BurstLen×Dmax) addressable byte storage locations, where BurstLen is the burst length of DMA controller 94. Controller 90 can separately and independently read and write access each byte stored in cache memory 100.

Figure 8:
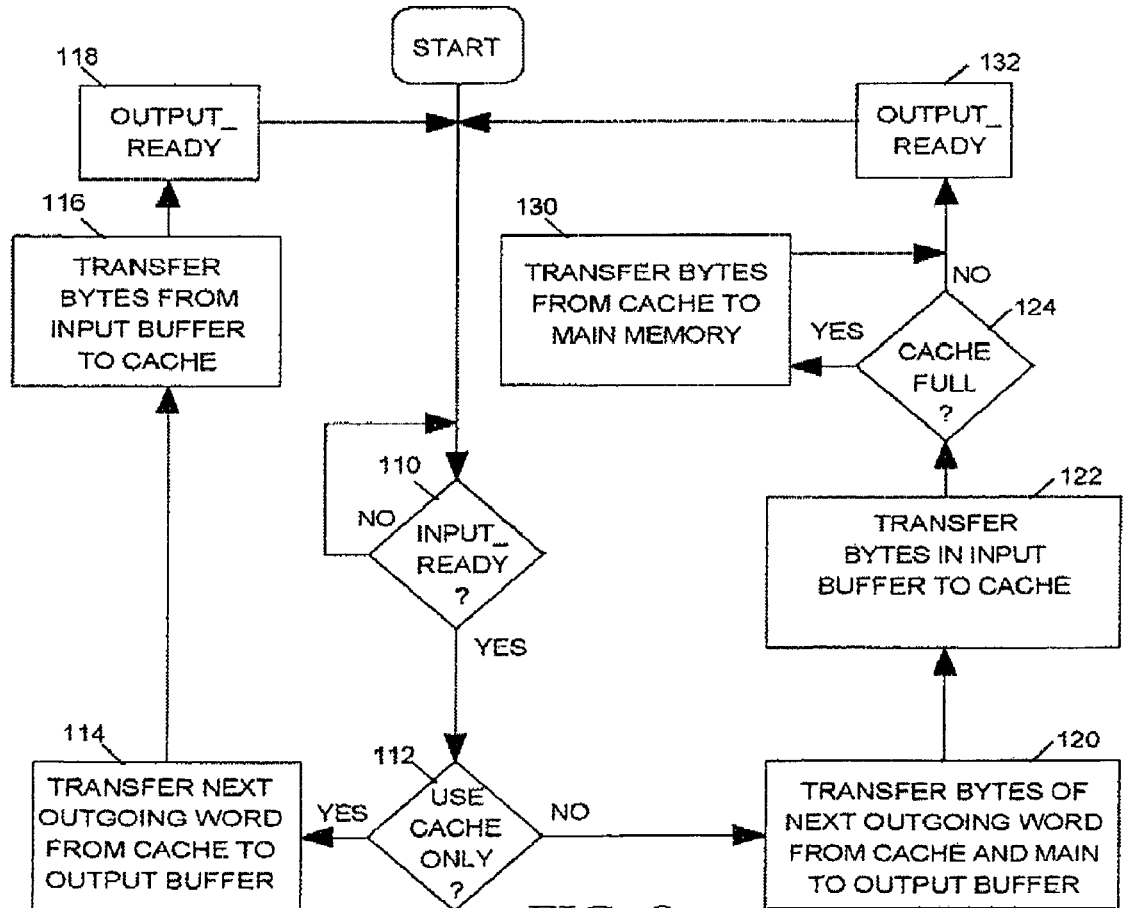
FIG. 8 is a flow chart representing an algorithm executed by the controller of FIG. 7.

FIG. 8 is a flow chart illustrating an example of controller 90 operation. Referring to FIGS. 7 and 8, controller 90 waits (step 110) until it detects an INPUT_READY signal pulse from an external circuit indicating a next word of incoming sequence B resides in input buffer 92. When the product of the word length N and interleaving depth D (N×D) does not exceed the number of bytes cache memory 100 can store (step 112), controller 90 responds to the INPUT_READY signal pulse by reading all bytes that are to form a next word of outgoing sequence B out of cache memory 100 and transferring them to output buffer 102 via multiplexer 98 (step 114). Controller 90 then writes all bytes of the incoming sequence word currently residing in input buffer 92 into cache memory 100 (step 116). Controller 90 then pulses the OUTPUT_READY signal (step 118) and returns to step 110 to await arrival of another word of incoming sequence B.

Whenever it writes bytes of an incoming sequence word into cache memory 100 at step 116, controller 90 overwrites the bytes forming the output sequence word last read out of cache memory 100 at step 114 because it is no longer necessary to store the overwritten bytes in cache memory 100. Note that when N×D is smaller than the number of available storage locations in cache memory 100, deinterleaver 89 does not use main memory 96 for byte storage.

When (N×D) is larger than the byte capacity of cache memory 100, the outgoing word is mainly stored in main memory 96 and controller 90 uses cache memory 100 to store only as many recently incoming sequence words as it can hold. Thus when controller 90 detects an INPUT_READY signal pulse (step 110) and when (N×D) is larger than the capacity of cache memory 100 (step 112), controller 90 responds to the INPUT_READY pulse by commanding DMA controller 94 to read bytes stored in main memory 96 that are to form the next word of outgoing sequence A. As DMA reads those bytes, controller 90 writes them into appropriate locations of output buffer 102 (step 120). Since not all of the bytes of the outgoing word being assembled in output buffer 102 reside in main memory 96, controller 90 obtains the missing bytes from recently arrived incoming words stored in cache memory 100 and writes them to the appropriate storage locations of output buffer 102 at step 120. After finishing transferring data bytes of the next word of outgoing sequence A from either main memory 96 or cache memory 100 into the output buffer 102, the controller 90 writes the bytes of the incoming sequence word stored in input buffer 92 into the cache memory 100 (step 122). When storing the incoming sequence word, the controller 90 determines whether cache memory 100 has become full (step 124). If so, controller 90 flushes the cache 100 by commanding DMA controller 94 to transfer data bytes stored in cache memory 100 into main memory 96 (step 130) by overwriting bytes that are no longer needed. After flushing cache memory 100, controller 90 stores the remaining bytes of the incoming sequence word into cache memory 100. After storing the incoming sequence word in the cache memory 100, controller 90 pulses the OUTPUT_READY signal (step 132) to signal an external circuit that the next word of output sequence A is available in output buffer 102.

Thus as described above, deinterleaver 89 uses main memory 96 for storing bytes only when the N×D exceeds the number of available storage locations in cache memory 100 and uses cache memory 100 for storing all bytes of the most recent D incoming words and the next D output words. Otherwise deinterleaver 39 uses cache memory 96 for storing only as many words of incoming sequence as it can hold, and when cache memory 100 is filled, controller 90 commands DMA controller 94 to transfer the contents of cache memory 100 to main memory 96. As it writes incoming word bytes into cache memory 100 at step 122, controller 90 rearranges the order of the bytes so that DMA controller 94 writes them into successive addresses of main memory 96 in an order in which they will be needed later at step 120 when they are transferred to the output buffer. This renders the DMA read operation carried out at step 120 more efficient because it increases the percentage of bytes read out of main memory 96 that can be incorporated into the output sequence word being assembled in output buffer 102. Cache memory 100 therefore helps to minimize the number of times DMA controller 94 must read access main memory 96, thereby increasing the deinterleaver's maximum throughput.

Deinterleaver Algorithm

The following is a list of variables employed in a pseudocode representation of an example algorithm implemented by controller 90 of deinterleaver 89:

| | |
|---|---|
| Dmax | Maximum interleaver depth (64, for ADSL applications) |
| BurstLen | Burst length of DMA (16, 32, or 64, and so on) |
| D | Interleaver depth |
| N | FEC codeword length |
| I | Codeword index, i = 0, 1, 2, . . . , D − 1 |
| J | Byte index within the codeword, j = 0, 1, 2, . . . , N − 1 |
| UseIntBuf | Indicates using the internal cache as the interleaving buffer |
| DmaRdLen | DMA read length, equal to N |
| DmaRdAddr | Starting address of the system memory for DMA read request |
| DmaWrLen | DMA write length, equal to (BurstLen Dmax/D) |
| DmrWrAddr | Starting address of the system memory for DMA write request |
| DmaWrRqCnt | DMA write request count during the cache flush, DmaWrRqCnt = 0, 1, 2, . . . , D − 1 |
| DmaWrPtr | Pointer of the data transfer during each DMA write, DmaWrPtr = 0, 1, 2, . . . , DmaWrLen − 1, for DMA write of DmaWrLen bytes |
| CacheFlushCnt | Cache flush count during each D-codewords cycle, CacheFlushCnt = 0, 1, 2, . . . , ceil((N D)/(BurstLen Dmax)) − 1 |
| InRdPtr | Pointer for reading from the input buffer when performing codeword pre-storage |
| CacheWrPtr | Pointer for writing into the cache during codeword pre-storage |
| CacheRdPtr | Pointer for reading from the cache during codeword update or internal data transfer |
| OutWrPtr | Pointer for writing into the output buffer during codeword extraction |

The following is a pseudocode representation of an example algorithm implemented by controller 90 of interleaver 89:
1. Initialize a D-codewords cycle
   a. Set i=0, CacheFlushCnt=0, CacheWrPtr=0.
   b. If (N D)<(BurstLen Dmax), set UseIntBuf=1. Else, set UseIntBuf=0.
2. Wait for input codeword
   a. Wait until an input codeword is ready from demodulator.
   b. If (UseIntBuf==1), go to step 3. Else, go to step 4.
3. Internal data transfer
   a. Read the N-bytes codeword from cache and write directly into output buffer with
      OutWrPtr=mod(N-floor(i N/D)+j,N) and
      CacheRdPtr=mod(i N,D)+j D, for j=0, 1, 2, . . . , N−1.
   b. Set InRdPtr=0.
   c. Go to step 5.
4. DMA read
   a. Make a DMA read request of DmaRdLen bytes starting at DmaRdAddr=mod(i N,D) 256.
   b. Start DMA data transfer after the request is granted. During the N-bytes data transfer,
      the j-th byte is taken from the system memory and written into output buffer with
      OutWrPtr=mod(Nfloor(i N/D)+j,N), for j=0, 1, 2, . . . , N−1. Once j reaches CacheFlushCnt DmaWrLen, use the data from cache at
      CacheRdPtr=mod(i N,D)+mod(j,DmaWrLen) D in lieu of the data from the system memory. Continue the replacement until OutWrPtr reaches 0.
   c. Set InRdPtr=0.
5. Codeword pre-storage
   a. While (InRdPtr<N and CacheWrPtr<BurstLen Dmax), take one codeword byte
      in the input buffer and write into the cache. Set InRdPtr=InRd+1,
      CacheWrPtr=CacheWrPtr+1 after each byte extraction.
   b. If ((InRdPtr==N and i<D−1) or (UseIntBuf==1)), go to step 7. Else, go to step 6.
6. Cache flush
   a. Set DmaWrRqCnt=0.
   b. While (DmaWrRqCnt<D), make a DMA write of min (DmaWrLen,N-CacheFlushCnt DmaWrLen) bytes starting at DmaWrAddr=CacheFlushCnt DmaWrLen+DmaWrRqCnt 256. During the DMA
      transfer, each byte is read from the cache and written into system memory with
      CacheRdPtr=DmaWrPtr D+DmaWrRqCnt. After the DMA transfer,
      set DmaWrRqCnt=DmaWrRqCnt+1.
   c. Set CacheWrPtr=0.
   d. If (InRdPtr<N), go to step 5. Else, go to step 7.
7. Output ready
   a. Set i=i+1 and signal output ready.
   b. If (i==D), go to step 1. Else, go to step 2.

Since specifications for ADSL/ADSL2/ADSL2+limit acceptable values of interleaving depth D to one of the set {2, 4, 8, 16, 32, 64 . . . }, algorithm steps above involving dividing by D and mod(D) are easy to implement. Also, with D limited to powers of 2, the DMA read/write length of (BurstLen× Dmax/D) is guaranteed a multiple of the burst length. The pseudocode descriptions of interleaver and deinterleaver controller algorithms listed above assume this limitation on interleaving depth. However in general, D may not be restricted to these power of 2 and in that case, the DMA read/write length of (BurstLen×Dmax/D) should be modified to (BurstLen× ceil(Dmax/D)).

In implementing the above-described algorithm for controller 40 of FIG. 5, controller 40 causes DMA controller 44 to write every byte of each incoming sequence word in input buffer 42 to main memory 46, and to also write bytes of that incoming word needed to complete output sequence words residing in cache memory 50 directly to the cache memory. Thus some of the bytes DMA controller 44 write to main memory 46 will not be needed later when they are subsequently read back out of main memory 46. The redundant bytes are nonetheless written to and read from main memory 96 because it allows the controller algorithm to be less complicated. However, in alternative embodiments of the invention, controller 40 can be programmed to cause DMA controller 44 to write to main memory 46 only those bytes of the word stored in input buffer 42 that are not directly written into cache memory 50. This modification further increases DMA write transfer efficiency by eliminating the need to write redundant bytes, and also decreases the minimum number of byte storage locations main memory 46 needs by the amount of the available space (BurstLen×Dmax) in cache memory 50.

In implementing the above-described algorithm for controller 90 of deinterleaver 89 of FIG. 7, controller 90 transfers every byte of every outgoing sequence word stored in main memory 96 to output buffer 102. However some of the bytes read from main memory 96 are not up-to-date and have to be replaced by bytes from cache memory 100 representing some of the most recently arrived bytes. Therefore, those redundant bytes need not be read from main memory 96 since they are not up-to-date. Accordingly, in alternative embodiments of the invention, only bytes that needed in output sequence words not yet generated are read from main memory 96 when constructing bytes of the next outgoing word. This further increases both DMA read transfer efficiency by eliminating the need to transfer redundant bytes out of main memory 96 and also decreases the necessary size of main memory by the size (BurstLen×Dmax) of the cache memory.

Thus, the invention provides a reduction of internal memory size over that required by the prior art interleavers or deinterleavers employing only internal memory. For each interleaving data path, the internal memory requirement is reduced from (Nmax×Dmax) bytes to (BurstLen×Dmax) bytes for a savings of (Nmax−BurstLen)'Dmax bytes. For example for ADSL2/ADSL2+, where four interleaving data paths are required, the total internal memory savings is (255-16) ×64=48896 bytes.

The pre-fetch/pre-store function of the internal cached also permits every byte read or written from or to the external memory through DMA to be used, except for only the relatively few bytes that are overwritten by bytes that must be obtained from recently arrived incoming words before they are written into the main memory. Thus, the cache memory helps to increase DMA transfer efficiency over that of the prior art interleavers or deinterleavers employing only external memory.

The specification herein above and the drawings describe exemplary embodiments of best modes of practicing the invention, and elements or steps of the depicted best modes exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiments of the invention depicted in the specification and drawings.

The invention claimed is:

1. An apparatus for forming a sequence of N-byte second words from bytes forming a sequence of N-byte first words, where N is any integer greater than 1, the apparatus comprising:
 a main memory for storing a plurality of bytes, each at a separate address;
 a cache memory for storing a plurality of bytes, each at a separate address, wherein the size of the main memory is larger than that of the cache memory; and
 a control circuit, coupled to the main memory and the cache memory, for comparing the size of the cache memory with a product of the data length, N and a desired interleaving/de-interleaving depth, D to produce a control signal, for writing bytes of each first word into either the main memory or the cache memory according to the control signal, for reading bytes out of the cache memory or the main memory and forming each second word according to the control signal such that each second word comprises the bytes of more than one of the first words.

2. The apparatus in accordance with claim 1 wherein the cache memory and the control circuit are implemented within a single integrated circuit (IC), and wherein the main memory is external to the IC.

3. The apparatus in accordance with claim 1 wherein
 the control circuit operates in a burst read mode in which it reads bytes stored at a plurality of sequential addresses of the main memory whenever it read accesses the main memory,
 wherein the control circuit operates in a burst write mode in which it writes bytes to a plurality of sequential addresses of the main memory whenever it write accesses the main memory, and
 wherein the control circuit independently read and write accesses each individual address of the cache memory whenever it reads a byte from or writes a byte to the cache memory.

4. The apparatus in accordance with claim 1
 wherein the control circuit writes bytes of each first word into the main memory so that they are addressed in the main memory in an order in which those bytes appear in the first word,
 wherein the control circuit reads bytes out of the main memory and writes them to the cache memory, and
 wherein the memory control circuit forms each second word from bytes it reads out of the cache memory.

5. The apparatus in accordance with claim 1
 wherein the control circuit writes bytes of each first word into the cache memory,
 wherein the control circuit reads bytes of the first words out of the cache memory and writes them to the main memory such that they are addressed in the main memory in an order in which they are to appear in the second words, and
 wherein the control circuit forms each second word from bytes it reads out of the cache memory and the main memory.

6. The apparatus in accordance with claim 4 further comprising:
 an input buffer for receiving and storing bytes forming each first word, wherein the control circuit reads bytes forming each first word from the input buffer and writes them to the main memory so that they are addressed in the main memory in an order in which the bytes appear in that first word, and also reads bytes forming first words out of the input buffer and writes them to the cache memory, and
 an output buffer, wherein the control circuit forms the second words in the output buffer by reading bytes out of the cache memory and writing them into the output buffer.

7. The apparatus in accordance with claim 5 further comprising:
 an input buffer for receiving and storing each first word, wherein the control circuit transfers bytes forming each first word from the input buffer to the cache memory; and
 an output buffer, wherein the control circuit forms the second words in the output buffer by reading bytes out of the main memory and out of the cache memory and writing them into the output buffer.

8. The apparatus in accordance with claim 6 wherein the control circuit writes every byte of each first word into the main memory.

9. The apparatus in accordance with claim 6 wherein the control circuit writes some, but less than all, bytes of each first word into the main memory.

10. The apparatus in accordance with claim 7 wherein the control circuit writes every byte of each first word into the main memory.

11. The apparatus in accordance with claim 7 wherein the control circuit writes every byte of each first word into the main memory.

12. A method for forming a sequence of N-byte second words from bytes forming a sequence of N-byte first words, wherein N is any integer greater than 1, the method comprising the steps of:
 comparing the size of the cache memory with a product of the data length, N and a desired interleaving/de-interleaving depth, D to produce a control signal,
 writing bytes of each first word into a main memory or into a cache memory according to the control signal,
 transferring bytes between the main memory and the cache memory according to the control signal, and
 reading bytes of the cache memory or the main memory and forming each second word according to the control signal such that each second word comprises the bytes of more than one of the first words.

13. The method in accordance with claim 12
 wherein a plurality of bytes are read from a plurality of sequential addresses of the main memory in a burst read mode of accessing the main memory whenever the main memory is read accessed,
 wherein a plurality of bytes are written to a plurality of sequential addresses of the main memory in a burst write mode whenever the main memory is write accessed, and
 wherein a single address of the cache memory is independently read or write accessed whenever the cache memory is read or write accessed.

14. The method in accordance with claim 12
 wherein the step of writing comprises writing bytes of each first word into the main memory so that they are addressed in the main memory in an order in which those bytes appear in that first word, and
 wherein the step of transferring comprises reading bytes out of the main memory and writing them to the cache memory, and wherein the step of reading comprises forming each second word from bytes read out of the cache memory.

15. The method in accordance with claim 12
wherein the step of writing comprises writing bytes of each first word into the cache memory, wherein the step of transferring comprises reading bytes out of the cache memory and writing them to the main memory, and
wherein the step of reading comprises forming each second word from bytes read out of the cache memory and the main memory.

16. The method in accordance with claim 12
wherein the step of writing comprises, for each first word, the substeps of:
storing bytes forming each first word in an input buffer,
reading bytes of each first word stored in the input buffer and writing them to the main memory, and
reading selected bytes of each first word stored in the input buffer and writing them to selected addresses of the cache memory;
wherein the step of transferring comprises reading bytes out of the main memory and writing them into the cache memory; and
wherein the step of writing comprises reading bytes forming the second word out of the cache memory and writing them into an output buffer.

17. The method in accordance with claim 12
wherein the step of writing comprises, for each first word, the substeps of:
storing bytes forming the first word in an input buffer, and
reading bytes of the first word from the input buffer and writing them to the cache memory,
wherein the step of transferring comprises reading bytes forming the first word out of the cache memory and writing them to the main memory, and
wherein the step of writing comprises, for each second word, the substeps of reading bytes forming the second word out of the main memory and out of the cache memory; and
writing them into an output buffer to form the second word in the output buffer.

18. The method in accordance with claim 16 wherein the substep of reading bytes of the step of writing comprises reading all bytes of the first word out of the input buffer and writing them into the main memory.

19. The method in accordance with claim 16 wherein the substep of reading bytes of the step of writing comprises reading less than all bytes of the first word out of the input buffer and writing them to the main memory.

20. The method in accordance with claim 17 wherein the step of transferring comprises reading all bytes of the first word written into the cache memory back out of the cache memory and writing them to the main memory.

21. The method in accordance with claim 17 wherein the step of transferring comprises reading less than all of the bytes of the first word written into the cache memory back out of the cache memory and writing them into the output buffer.

22. The apparatus of claim 1, wherein the size of the cache memory is not smaller than a product of a maximum of the interleaving/de-interleaving depth and a number of bytes read from or written to a sequential address of the main memory during each read or write access.

23. The apparatus of claim 22, wherein the size of the main memory is not smaller than a product of a largest allowable interleaving/de-interleaving depth and a largest allowable byte width of code word.

24. The method of claim 12, wherein the size of the cache memory is not smaller than a product of a maximum of the interleaving/de-interleaving depth and a number of bytes read from or written to a sequential address of the main memory during each read or write access.

25. The method of claim 24, wherein the size of the main memory is not smaller than a product of a largest allowable interleaving/de-interleaving depth and a largest allowable byte width of code word.

* * * * *